United States Patent [19]

Patel

[11] Patent Number: 5,208,823
[45] Date of Patent: May 4, 1993

[54] OPTICALLY ISOLATED LASER DIODE ARRAY

[75] Inventor: Rushikesh Patel, Pomona, Calif.

[73] Assignee: Applied Solar Energy Corporation, City of Industry, Calif.

[21] Appl. No.: 753,970

[22] Filed: Sep. 3, 1991

[51] Int. Cl.⁵ .......................... H01S 3/19; H01L 21/20
[52] U.S. Cl. ........................................ 372/50; 437/129
[58] Field of Search ............... 437/129, 128, 127, 133; 372/50, 45, 46

[56] References Cited

U.S. PATENT DOCUMENTS

| | | | |
|---|---|---|---|
| 4,371,968 | 2/1983 | Trussell, Jr. et al. | 372/50 |
| 4,577,321 | 3/1986 | Carney et al. | 372/50 |
| 4,674,095 | 6/1987 | Heinen et al. | 372/50 |
| 4,712,220 | 12/1987 | Luft | 372/50 |
| 4,803,691 | 2/1989 | Scifres et al. | 372/150 |
| 4,831,629 | 5/1989 | Paoli et al. | 372/50 |
| 4,870,652 | 9/1989 | Thornton | 372/50 |
| 4,871,690 | 10/1989 | Holonyak, Jr. et al. | 437/133 |
| 4,878,223 | 10/1989 | Morimoto et al. | 372/50 |
| 5,108,948 | 4/1992 | Murakami et al. | 437/133 |
| 5,124,279 | 6/1992 | Goto | 437/129 |

FOREIGN PATENT DOCUMENTS

| | | | |
|---|---|---|---|
| 319207 | 6/1989 | European Pat. Off. | 437/129 |
| 154692 | 8/1985 | Japan | 372/50 |
| 154694 | 8/1985 | Japan | 372/50 |
| 14488 | 1/1987 | Japan | 372/45 |
| 173186 | 7/1991 | Japan | 372/46 |

Primary Examiner—Brian E. Hearn
Assistant Examiner—Linda J. Fleck
Attorney, Agent, or Firm—Poms, Smith, Lande & Rose

[57] ABSTRACT

An optically isolated laser diode array is formed by growing a quantum well layer on a substrate after a plurality of strips are placed on the substrate. As the lattice of the quantum well of layer grows over the strips, it deforms the lattice structure of such layer causing it to be optically lossy in the regions above the strips. An insulative layer may then be deposited on the quantum well layer and patterned so that electrical contact may be made to the quantum well layer active regions which are disposed between each of the strips. In these active regions, the quantum well layer lattice structure is well formed to provide high quality active regions for laser diodes.

20 Claims, 1 Drawing Sheet

OPTICALLY ISOLATED LASER DIODE ARRAY

FIELD OF THE INVENTION

The present invention relates generally to semiconductor laser diodes and, more particularly, to a novel method for fabricating a laser diode array and to an array formed by such method wherein the active region of each laser diode is optically isolated from the active region of the other laser diode in the array.

BACKGROUND OF THE INVENTION

A typical laser diode array has a plurality of laser diode active regions formed on a common substrate. Generally, a quantum well layer is disposed on the substrate and the active regions in the quantum well layer may be optically isolated from each other by various techniques. Electrical connection may be made to each of the active regions individually for an addressable array or to all regions simultaneously for phase coupled laser diode array having a continuous wave high power output (the output power of each individual active region being combined with each other active region).

The optical isolation between each active region in the quantum well layer is required to prevent lateral coupling of optical energy between adjacent active regions. Such lateral coupling may cause unwanted oscillations and reduce the optical power output of the device in the phase coupled array. In an addressable array, the lateral coupling may cause crosstalk. Such crosstalk could introduce bit errors where the array is used for fiber optic communications. Accordingly, several techniques isolating the active regions of the quantum well layer in the laser diode array have been developed in the prior art.

For example, Thornton, U.S. Pat. No. 4,870,652 and Paoli, et al., U.S. Pat. No. 4,831,629 show that the use of diffused regions which extend into the multiple quantum well layer will provide lateral isolation between adjacent laser diode active regions. The diffused regions will absorb laterally propagating optical energy from the active regions to minimize crosstalk and undesired transverse modes.

Another technique developed in the prior art is the use of a plurality of parallel etched grooves extending in the longitudinal direction through the quantum well layer, as disclosed in Scifres, et al., U.S. Pat. No. 4,803,691. The grooves reflect and scatter the laterally propagating light such that the optical coupling between adjacent active regions is minimized.

Instead of diffused regions or scattering grooves to separate the active regions, an absorbent material may also be used to provide optical isolation. The absorbent material may be any of various semiconductor materials such as silicon or the exemplary III-V semiconductor compounds as disclosed in Luft, U.S. Pat. No. 4,712,220. One technique for placing absorbent material in between the active regions of the laser diode array is to etch the quantum well layer to form voids between the active regions. The absorbent semiconductor material is then grown within the voids between the active regions. For example, Trussel, et al., U.S. Pat. No. 4,371,968 discloses the regrowth of gallium aluminum arsenide within trenches formed between the active regions. Carney et al., U.S. Pat. No. 4,577,321 discloses the growth of cladding material to fill the voids between individual quantum well lasers. An overview of all the above techniques disclosed in Heinen et al., U.S. Pat. No. 4,674,095.

A significant disadvantage and limitation of each of the above described techniques for providing isolation between the quantum well layer active regions is that several additional processing steps are required to provide for the diffusion into the quantum well layer or for the regrowth of material within etched voids. The diffusion or regrowth must be performed at relatively high temperatures which causes dopant carriers within the device to further diffuse. This further diffusion may degrade device operating characteristics from the desired characteristics which had been established during the growing of the quantum well layer. Also, the additional processing steps increase wafer handling time and complexity of the device, each of which significantly adds to cost of the finished array. Accordingly, it would be desirable to provide for optical isolation within the quantum well layer at the time such layer is formed.

SUMMARY OF THE INVENTION

Accordingly, it is an object of the present invention to overcome one or more disadvantages and limitations in the prior art as enumerated hereinabove. It is an important object of the present invention to provide optical isolation in the quantum well layer during the fabrication of such layer. It is a further object of the present invention to provide an optically isolated laser diode array constructed by such method.

According to the present invention, an optically isolated laser diode array is formed by growing a quantum well layer on a substrate after a plurality of strips are placed on the substrate. As the lattice of the quantum well layer grows over the strips, it deforms the lattice structure of such layer causing it to be optically lossy in the regions above the strips. An insulative layer may then be deposited on the quantum well layer and patterned so that electrical contact may be made to the quantum well layer active regions which are disposed between each of the strips. In these active regions, the quantum well layer lattice structure is well formed to provide high quality active regions for laser diodes. The quantum well layer may be a single or multiple quantum well layer.

An advantage of the present invention over the prior art is that the strips are relatively easy to pattern. For example, the strips may be formed from any suitable insulator. For example, the insulator maybe deposited on the substrate by conventional techniques. The insulator is then selectively removed to form the strips. This step is performed before any growth of the quantum well layer so that the isolation of the active regions in the quantum well layer is accomplished during the growth of this layer. This aspect of the present invention is to be compared to the prior art wherein the lossy regions are formed subsequently to the growth of the quantum well layer which may disturb the quality of this layer in the active regions. The insulator may be any of silicon dioxide, aluminum oxide, or silicon nitride, for example, or any other insulator which can be used to form strips on a semiconductor substrate.

These and other objects, advantages and features of the present invention will become readily apparent to those skilled in the art from a study of the following description of an exemplary preferred embodiment when read in conjunction with the attached drawing and appended claims.

DESCRIPTION OF AN EXEMPLARY PREFERRED EMBODIMENT

Figure 1:
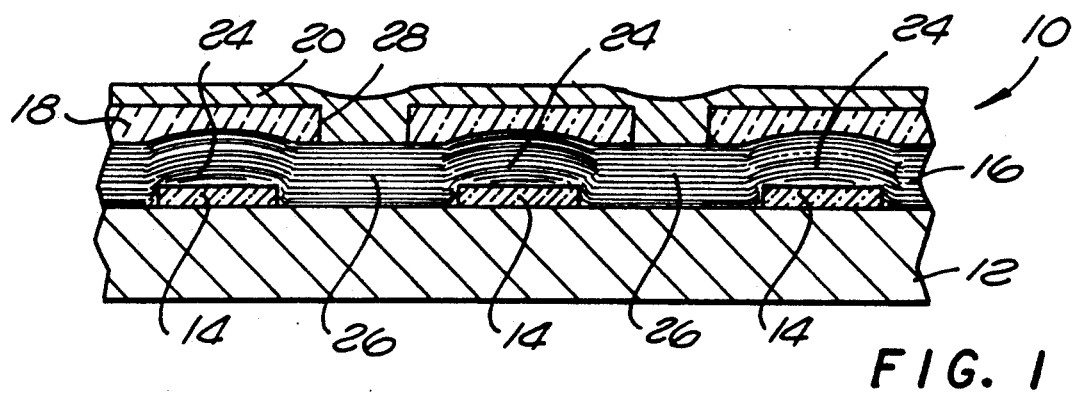
FIG. 1 is a cross-sectional view, broken away, of an exemplary laser diode array constructed according to the principles of the present invention.

Referring now to FIG. 1, there is shown a cross-section, broken away, of a partial optically isolated laser diode array 10 constructed according to the principles of the present invention. The diode array 10 includes a semiconductor substrate 12, a plurality of spaced apart elongated strips 14, a semiconductor quantum well layer 16, an electrically insulative layer 18, and an electrically conductive layer 20. Each of these elements of the laser diode array 10 is described in greater detail hereinbelow.

Figure 2:
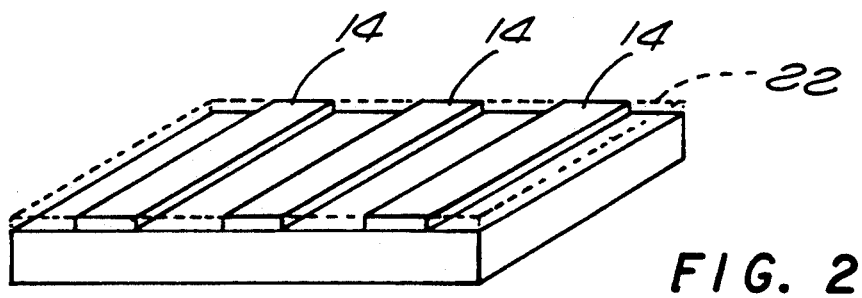
FIG. 2 is a perspective view of the laser diode array of FIG. 1 as would be shown at an intermediate fabrication step.

With further reference to FIG. 2, there is shown a perspective view of the substrate 12 with the strips 14 thereon as it would appear at an intermediate fabrication step. To form the strips 14 on the substrate 12, an insulator layer 22 (shown in phantom) is formed on the substrate 12. The insulator layer 22 is then selectively etched, as is well known in the art, so that the strips 14 remain. In one exemplary embodiment of the present invention, the strips 14, have a width in the range of three to ten microns.

In a typical laser diode array, the substrate 12 is formed from gallium arsenide to provide high quality lattice matching to the gallium arsenide/aluminum gallium arsenide quantum well layer 16. These materials are preferred for their optical properties. The insulator layer maybe formed from any type of suitable insulator, for example silicon dioxide, aluminum oxide or silicon nitride. It is to be understood that the insulator layer 22 is not limited to these examples but may be any insulative material which can form strips on the type of semiconductor material used for the substrate 12.

Figure 4:
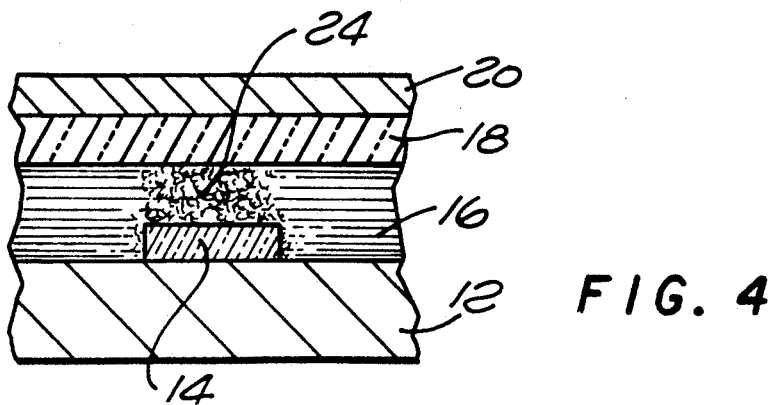
FIG. 4 is an enlarged view of a portion of FIG. 1 illustrating the dislocation of the quantum well layer to provide an optically lossy region.

The semiconductor quantum well layer 16 is disposed on the substrate 12 overlying the strips 14. The quantum well layer 16 is displaced in regions 24 above each of the strips 14, as is best seen in FIG. 4, such that the regions 24 become optically lossy.

In an exemplary embodiment of the present invention, the quantum well layer 16 is epitaxially grown on the substrate 12. The epitaxial growth causes the lattice structure of the quantum well layer 16 to be deformed above the strips such that the optically lossy regions 24 are formed. Typically, the epitaxial growth is through an MOCVD growth of alternating layers of aluminum gallium arsenide and gallium arsenide selected to form at least a single quantum well layer. A multiple quantum well structure is formed by repeating this pattern with several alternating layers of aluminum gallium arsenide and gallium arsenide as is well known in the art.

More particularly, the strips 14 present a discontinuity to the MOCVD growth on the substrate 12. The lattice structure of the quantum well layer 16 above the strips 14 is displaced such that the lattice of quantum well layer 16 becomes polycrystalline. This polycrystalline growth forms the lossy regions 24. Intermediate and alternatingly spaced between the strips 14, the remaining lattice structure of the quantum well layer 16 is of high quality and matched well to the lattice structure of the substrate 12 so that laser diode active regions 26 are formed.

Figure 3:
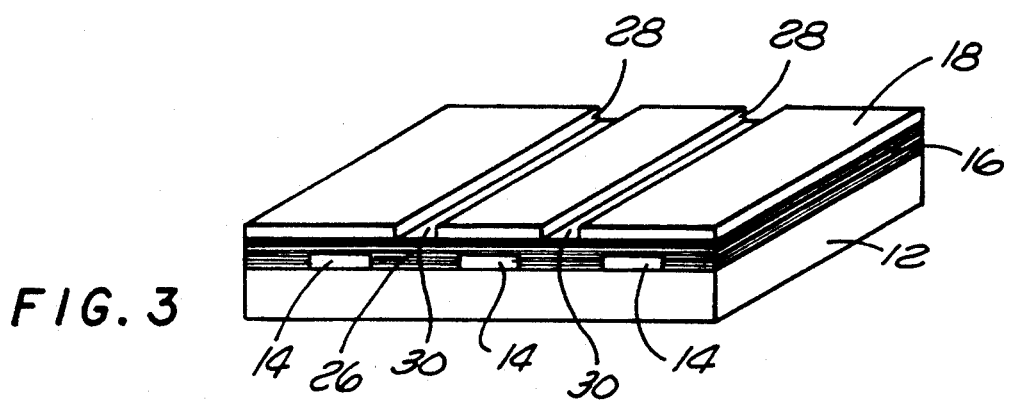
FIG. 3 is a perspective view of the laser diode array of FIG. 1 as would be shown at a subsequent intermediate fabrication step.

With further reference to FIG. 3, the insulative layer 18 which is disposed on the quantum well layer 16 has a plurality of elongated trenches 28. Each of the trenches 28 exposes a portion 30 of the quantum well layer 16 thereunder. The trenches are alternatingly disposed intermediate the strips 14, thereby also being disposed above the active regions 26. The insulative layer 18 may also be formed from deposited silicon dioxide, aluminum oxide or silicon nitride and conventionally etched to form the trenches 28.

Referring again to FIG. 1, the electrically conductive layer 20 is formed to fill each of the trenches 28. The conductive layer 20 is further in electrical communication with the exposed portion 30 of the quantum well layer 16 above each of the active regions 26. By leaving the inductive layer contiguous on top of the array 10, the laser diode active regions 26 are in electrical communication with each other. Thus, a phase coupled laser diode array may be fabricated. By selectively removing the metal layer 20 from the top surface of the insulative layer 18, but leaving the metal within the trenches 28, individual addressable laser diodes in each of the active regions are thereby formed. The conductive layer 20 may typically be formed by any conventional metal which forms an ohmic contact with gallium arsenide. The use of the strips 14 to form the optically lossy regions allows for tighter lateral packing of the active regions 26.

There has been described above a novel laser diode array and method for constructing the same. Those skilled in the art may now make numerous uses of the departures from the above described exemplary preferred embodiment without departing from the inventive concepts described herein. Accordingly, the present invention is to be defined solely by the following claims.

I claim:

1. An optically isolated laser diode array comprising:
  a semiconductor substrate;
  a plurality of spaced apart elongated strips disposed on said substrate;
  a semiconductor quantum well layer disposed on said substrate overlying said strips, said quantum well layer being displaced in regions thereof above each of said strips such that said regions are optically lossy;
  an electrically insulative layer disposed on said quantum well layer, said insulative layer having a plurality of elongated trenches wherein each of said trenches exposes a portion of said quantum well layer thereunder, said trenches being alternatingly disposed intermediate said strips; and
  an electrically conductive layer fillingly disposed in each of said trenches in electrical communication with said exposed portion of said quantum well layer, whereby a plurality of laser diode active regions are formed in said quantum layer under each of said trenches and are optically isolated from each other by said optically lossy regions.

2. A laser diode array as set forth in claim 1 wherein said substrate is gallium arsenide.

3. A laser diode array as set forth in claim 1 wherein said strips are one of silicon dioxide, aluminum oxide and silicon nitride.

4. A laser diose array as set forth in claim 1 wherein said strips have the width in the range of three to ten microns.

5. A laser diode array as set forth in claim 1 wherein said quantum well layer is formed from alternatingly stacked layers of aluminum gallium arsenide and gallium arsenide.

6. A laser diode array as set forth in claim 1 wherein said insulative layer is one of silicon dioxide, aluminum oxide, and silicon nitride.

7. A laser diode array as set forth in claim 1 wherein said conductive layer is formed from a metal selected to form an ohmic contact with gallium arsenide.

8. An optically isolated laser diode array comprising:
a gallium arsenide substrate;
a plurality of space apart elongated silicon dioxide strips disposed on said substrate;
a quantum well layer being formed from alternatingly stacked layers of aluminum gallium arsenide and gallium arsenide and disposed on said substrate overlying said strips, said quantum well layer being displaced in regions thereof above each of said strips such that said regions are optically lossy;
a silicon dioxide layer disposed on said quantum well layer, said silicon dioxide layer having a plurality of elongated trenches wherein each of said trenches exposes a portion of said quantum well layer thereunder, said trenches being alternatingly disposed intermediate said strips; and
an electrically conductive layer fillingly disposed in each of said trenches in electrical communication with said exposed portion of said quantum well layer, whereby a plurality of laser diode active regions are formed in said quantum well layer under each of said trenches and are optically isolated from each other by said optically lossy regions.

9. A laser diode array is set forth in claim 8 wherein said quantum well layer is formed by MOCVD epitaxial growth.

10. A laser diode array as set forth in claim 9 wherein said epitaxial growth forms polycrystalline structure above said strips to form said lossy regions.

11. A laser diode array as set forth in claim 8 wherein said strips have a width and a range of three to ten microns.

12. A method for fabricating an optically isolated laser diode array comprising:

providing a substrate;
forming a plurality of spaced apart elongated strips on said substrate;
forming a quantum well layer on said substrate overlying said strips such that said quantum well layer becomes displaced in regions thereof above said strip so that said regions are optically lossy;
forming an electrically insulative layer on said quantum well layer to have a plurality of elongated trenches wherein each of said trenches exposes a portion of said quantum well layer thereunder, said trenches being alternatingly disposed intermediate said strips; and
forming an electrically conductive layer fillingly disposed in each of said trenches in electrical communication with said exposed portion of said quantum well layer, whereby a plurality of laser diode active regions are formed in said quantum well layer under each of said trenches and are optically isolated from each other from said optically lossy regions.

13. A method as set forth in claim 12 wherein said forming of said strips includes:
forming an oxide layer on said substrate; and selectively etching said oxide layer to form said strips.

14. A method as set forth in claim 13 wherein said forming said oxide layer includes depositing silicon dioxide on said substrate.

15. A method as set forth in claim 12 wherein said forming of said quantum well layer includes epitaxially growing said quantum well layer on said substrate such that polycrystalline structure is formed above said strips to form said lossy regions.

16. A method as set forth in claim 15 wherein said growing includes MOCVD of alternating layers of aluminum arsenide and gallium arsenide.

17. A method as set forth in claim 12 wherein said forming said insulative layer includes:
forming an oxide layer on said quantum well layers; and
selectively etching said oxide layer to form said trenches.

18. A method as set forth in claim 17 wherein said forming said oxide layer includes depositing silicon dioxide on said quantum well layer.

19. A method as set forth in claim 12 wherein forming said conductive layer includes depositing a metal selected to form an ohmic contact with said quantum well layer on said oxide layer.

20. A method as set forth in claim 19 wherein forming said conductive layer further includes selectively etching said conductive layer so that electrical connection is made to each individual one of said active regions.

* * * * *